United States Patent [19]

Nishizawa

[11] 4,334,235

[45] Jun. 8, 1982

[54] INSULATED GATE TYPE SEMICONDUCTOR DEVICE

[75] Inventor: Jun-ichi Nishizawa, Sendai, Japan

[73] Assignee: Zaidan Hojin Handotai Kenkyu Shinkokai, Sendai, Japan

[21] Appl. No.: 20,498

[22] Filed: Mar. 14, 1979

[30] Foreign Application Priority Data

Mar. 23, 1978 [JP] Japan .................. 53-33942

[51] Int. Cl.$^3$ ............................. H01L 29/78
[52] U.S. Cl. .................... 357/23; 357/22; 357/55; 357/41
[58] Field of Search ........... 357/55, 23, 41, 22

[56] References Cited

U.S. PATENT DOCUMENTS

| | | | |
|---|---|---|---|
| 3,631,310 | 12/1971 | Das ........................ | 357/23 |
| 4,070,690 | 1/1978 | Wickstrom ............... | 357/68 |
| 4,122,544 | 10/1978 | McElroy ................... | 357/23 |
| 4,166,223 | 8/1979 | Bluzer ...................... | 357/23 |

FOREIGN PATENT DOCUMENTS 466434  1/1969  Switzerland ................ 357/23

OTHER PUBLICATIONS

Richman, *I.E.E.E. Trans. on Electron Devices*, vol. ED-16, No. 9, pp. 759–766, Sep. 1969.
Sigg et al., *I.E.E.E. Trans. on Electron Devices*, vol. ED-19 No. 1, Jan. 1972.

*Primary Examiner*—Martin H. Edlow
*Attorney, Agent, or Firm*—Cushman, Darby & Cushman

[57] ABSTRACT

In an insulated-gate type static induction transistor having a source region for supplying charge carriers, a channel region through which said carriers travel, an insulated electrode type gate structure to which is inputted a gate voltage for controlling the travel of those carriers. A sharp build-up and non-saturating current vs. voltage characteristic, a high transconductance, and a small inter-electrode capacitance for high-speed operation are achieved by either reducing the channel length, or by reducing the depth of the source region smaller than that of the drain region, or by forming adjacent to the source region a blocking region of high impurity concentration relative to the channel region, or by arranging the effective channel close to the insulated gate.

16 Claims, 16 Drawing Figures

INSULATED GATE TYPE SEMICONDUCTOR DEVICE

Related to and commonly assigned with the present application is copending application, U.S. Ser. No. 867,298, filed by Jun-ichi Nishizawa and Tadahiro Ohmi on Jan. 5, 1978, entitled, "Insulated Gate Static Induction Transistor and Integrated Circuit Including Same."

BACKGROUND OF THE INVENTION (a) Field of the Invention

The present invention relates to insulated gate type semiconductor device, and more particularly it pertains to insulated gate type semiconductor device such as insulated gate type static induction transistor which exhibits non-saturating type current vs. voltage characteristic.

(b) Description of the Prior Art

The known insulated gate type field effect transistor (hereinafter to be referred to as IG-FET) exhibits a so-called saturating type current vs. voltage characteristic whereby the drain current becomes saturated beyond a pinch-off drain voltage. In addition, the known IG-FET exhibits a large gate-source capacitance $C_{gs}$, a large gate-drain capacitance $C_{gd}$, and a large gate-substrate capacitance $C_{gsub}$, all of which serve as factors for hampering high-speed operation. Attempts are being made to enlarge transconductance and to reduce the aforesaid respective capacitances by reducing the channel length of the transistor. However, where it is intended to obtain a saturating type current vs. voltage characteristic from a transistor having a reduced length of channel, it becomes necessary to elevate the impurity concentration of the channel region. This, in turn, usually requires that the thickness of the insulating layer provided on the channel region be made small, and accordingly the manufacture of such transistor becomes difficult. On the other hand, it has been reported that where the channel length, i.e. the distance between the source and the drain, is reduced while the impurity concentration of the channel region is maintained at a similar magnitude, a non-saturating type current vs. voltage characteristic is obtained (P. Richman: "Modulation of space-charge-limited current flow in insulated-gate field effect tetrodes", IEEE Trans. on Electron Devices, Vol. ED-16, No. 9. p.p. 759–766, Sept., 1969). Such IG-FET is called "punch-through IG-FET", and as will be noted also from the title of the paper of Richman, the current flow is identified as space-charge-limited current. Apart from this, the present inventor has proposed a static induction transistor (hereinafter to be referred to as SIT) based on the discovery that the current saturation mechanism of known FET's (including junction FET and MOS FET) is ascribed to the negative feedback action of the series resistance from the source inclusive to the pinch-off point or pinched off portion inclusive. The SIT provides a non-saturating type current vs. voltage characteristic by reducing the channel length in order to reduce the aforesaid series resistance (Japanese Patent Publication NO. 52-6076). In an SIT having a channel region of the same conductivity type as that of the source region, even in the state that a potential barrier is produced in the channel by the depletion layer extending from the gate, the height of this potential barrier can be pulled down due to a static induction effect when a drain voltage is applied, and accordingly the drain current increases. This SIT no doubt includes, as a mode of operation, the state that the depletion layer extending from the gate does not cover all the channel, so that a neutral region remains locally in the channel connecting the source and the drain regions. Thus, in a certain gate bias state, the SIT provides operation of the "potential barrier height control type", i.e. the type where the current vs. voltage characteristic follows an exponential function in a low drain current region. In another certain gate bias state, a neutral region is present in the channel so that in a low current region, the transistor exhibits substantially a current vs. voltage characteristic of the type that depends almost entirely on the resistance of the neutral (non-depleted) channel region. It should be understood also that there can be an SIT which operates only under the channel condition where a potential barrier is formed in a current channel and carriers must traverse this potential barrier in flowing from the source to the drain.

Figure 1:
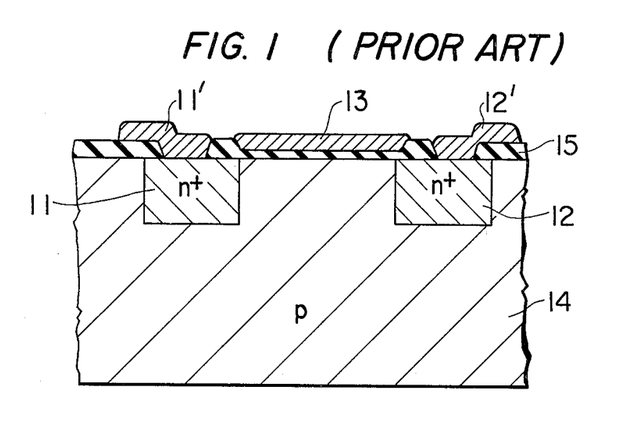
FIG. 1 is a schematic sectional view of known MOSFET.

A structure of the known IG-FET of n-channel type having a reduced channel length intended to reduce the series resistance is shown in FIG. 1. In this Figure, n+ type regions 11 and 12 represent a source region and a drain region, respectively, and a p type region 14 represents a substrate. Numerals 11' and 12' represent a source electrode and a drain electrode, respectively. They are ordinarily made with a metal such as aluminum. There may be an instance wherein a low resistivity polysilicon intervenes between the semiconductor crystal and the metal. Numeral 13 represents a gate electrode which is formed on top of a thin insulating layer, and this gate electrode may be made with a metal such as Al, Mo and W, or with a low resistivity polysilicon. In the structure shown in FIG. 1, it should be understood that, if the channel length, i.e. the distance between the source region 11 and drain region 12, is reduced while maintaining the impurity concentration of the p type region 14 at a similar value, the series resistance will be reduced and at the same time therewith the influence of the drain voltage will reach directly to the source region. Thus, electrons will also be injected from the deep-located portion of the source region that is remote from the semiconductor surface, and will form part of the drain current. Those electrons flowing through a deep portion of the semiconductor body can hardly be controlled by the gate voltage. Hence the efficiency of control of the drain current by the gate voltage will not be large, and the transconductance will become small.

SUMMARY OF THE INVENTION

The object of the present invention is to provide insulated gate type transistor which has a large transconductance and which is capable of exhibiting non-saturating type current vs. voltage characteristic.

An enhancement mode insulated gate type transistor has the arrangement that, adjacent to a channel region of one conductivity type, a source region and a drain region both having the other conductivity type, are provided and an insulated gate structure is provided on said channel region. When no gate voltage is applied, the source region, the channel region and the drain region are either of npn type or of pnp type. Accordingly, this enhancement mode insulated gate transistor has a structure resembling that of a bipolar transistor. Respective depletion layers are formed within the channel region extending from the pn junction between the source region and the channel region and extending from the pn junction between the channel region and the drain region. If the channel length is reduced, and the drain voltage is elevated above a certain level, the effective channel length will be reduced due to the growth of the depletion layer, so that the so-called punch-through phenomenon takes place. In this specification, the "punching-through" state is defined as meaning such state where a neutral region of an opposite conductivity type is no longer present between the source and the drain, and that only a potential barrier is present in the channel. Also, the "punched-through" state is defined the state wherein the potential barrier per se has also disappeared, i.e. the state wherein the potential decreases monotonically from the source toward the drain.

The present invention concerns an improvement of the insulated gate type transistor in which the portion located between the source region and the drain region is in the punching-through state. Such IG transistor is to be understood to behave in such a way that, by controlling the height of the potential barrier, the drain current will vary basically exponentially. Accordingly, such transistor will operate essentially in accordance with the same operation mechanism as that of SIT.

In order to obtain a large transconductance $g_m$, i.e., to efficiently control the drain current by the gate voltage, it is only necessary to efficiently establish and control a potential barrier by the gate voltage, in that specific portion of the semiconductor body through which the current actually flows. To this end, it is effective to positively limit the path through which those carriers injected from the source flow.

According to an embodiment of the present invention, the source region is formed thinner than the drain region. Those carriers which are allowed to flow from the source region toward the drain region depend upon the configuration of the source region. Thus, in the vicinity of the source region, the carriers will flow only through that area located close to the semiconductor surface, and as these carriers approach the drain region, they will spread deeply and flow through the bulk of the semiconductor body. Therefore, by forming a gate structure in the vicinity of the source region, the drain current can be efficiently controlled by controlling, with the gate voltage, that portion of the semiconductor body located close to the semiconductor surface.

According to another embodiment of the present invention, in at least that portion of the surface of the source region other than the portion facing the drain region, there is provided a blocking region having an impurity concentration higher than that of the channel region and having a conductivity type same as that of this channel region. Those carriers injected from the source region are oriented effectively toward the drain region, so that the current component that cannot be controlled by the gate voltage is reduced. Accordingly, a large transconductance $g_m$ is obtained.

According to still another embodiment of the present invention, the direction in which the carriers are allowed to flow is arranged to be substantially perpendicular relative to the semiconductor surface, the peripheral end portions of the channel region are cut away, and an insulated gate is formed on the cut-away side face of the channel region. Substantially all of those carriers injected from the source region will run toward the drain region, so that the transconductance will become large. Furthermore, these carriers will travel through the bulk, and thus mobility of the carriers is high.

These and other objects as well as the features and the advantages of the present invention will become apparent from the following detailed description of the present invention when taken in conjunction with the accompanying drawings.

DETAILED DESCRIPTION OF THE PREFERRED EMBODIMENTS

Figure 2:
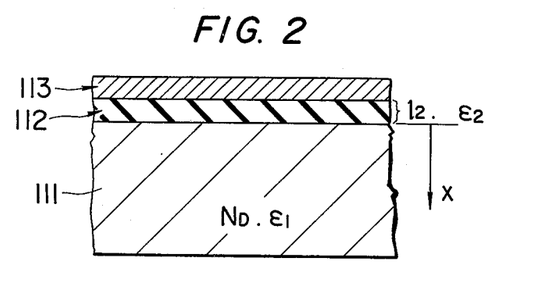
FIG. 2 is a schematic sectional view of insulated electrode for the explanation of the present invention.

First of all, a brief explanation will be made, by referring to FIG. 2, of the potential distribution and the electric field distribution of the insulated gate structure which is formed with a low resistivity electrode 113, an insulating layer 112 and a semiconductor body 111. Let us now assume that the thickness of the insulating layer 112 is $l_2$, the dielectric constant of this insulating layer 112 is $\epsilon_2$, the impurity concentration of the semiconductor body 111 is $N_D$, and the dielectric constant of this semiconductor body 111 is $\epsilon_1$. A coordinate x is taken toward the interior of the semiconductor body 111 from the interface between the insulating layer 112 and the semiconductor body 111 (hereinafter sometimes referred to as the transverse direction). Let us also assume that the reverse bias which is applied between the electrode 113 and the semiconductor body 111 and which includes the built-in potential is $V_a$, the voltage applied across the insulating layer 112 as $V_o$, the electric field within the insulating layer 112 as $E_D$, the electric field within the semiconductor body 111 as $E(x)$, the potential as $V(x)$, and the width (in the transverse direction) of the depletion layer as $W$. These items will be given their values, as elucidated on pages 93 to 95, Chapter 4 headlined as "Tunnet", in "Research of Semiconductor", vol. 13, published on July 10, 1977, by Kogyo Chosa-kai, Ltd., Tokyo, Japan, by:

$$W = \frac{\epsilon_1}{\epsilon_2} l_2 \left\{ -1 + \sqrt{1 + \left(\frac{\epsilon_2}{\epsilon_1} \cdot \frac{W_a}{l_2}\right)^2} \right\};$$

$$V_o = \frac{N_D e \epsilon_1 l_2^2}{\epsilon_2^2} \left\{ -1 + \sqrt{1 + \left(\frac{\epsilon_2}{\epsilon_1} \cdot \frac{W_a}{l_2}\right)^2} \right\};$$

$$E_o = \frac{N_D e \epsilon_1 l_2}{\epsilon_2^2} \left\{ -1 + \sqrt{1 + \left(\frac{\epsilon_2}{\epsilon_1} \cdot \frac{W_a}{l_2}\right)^2} \right\};$$

-continued $$E(x) = \frac{N_D e l_2}{\epsilon_2}\left\{-1 + \sqrt{1 + \left(\frac{\epsilon_2}{\epsilon_1} \cdot \frac{W_a}{l_2}\right)^2}\right\}(W - x);$$

$$V(x) = \frac{N_D e l_2}{\epsilon_2}\left\{-1 + \sqrt{1 + \left(\frac{\epsilon_2}{\epsilon_1} \cdot \frac{W_a}{l_2}\right)^2}\right\}\left(\frac{x^2}{2} - Wx + \frac{W^2}{2}\right),$$

wherein:
$W_a^2 = (2\epsilon_1 V_a / N_D e)$; and
e represents the magnitude of electronic charge.

Suppose that, in the structure shown, the semiconductor region 111 is of the n type. A reverse bias will mean the application of a negative voltage. In other words, a voltage is applied so as to drive off electrons from the vicinity of the interface.

Let us also assume that the insulating layer 112 is made with an SiO₂ film of 500 A. Provided that $N_D \leq 1 \times 10^{15}$ cm⁻³ or less, 80% or more of the voltage relative to $V_a$ of 1 V or higher will be applied to the semiconductor region 111 to thereby control the potential distribution within the semiconductor region 111. As a matter of course, the smaller the value of $N_D$ is, the higher the proportion of the voltage applied to the semiconductor region 111 will increase, and thus the potentials at deeper portions of the semiconductor region 111 will be controlled. If the insulating layer 112 is made with SiO₂ of 500 A, the depletion layer when $V_a = 1$ V will reach up to depths of about 11 μm, 3.5 μm and 1 μm for $N_D = 1 \times 10^{13}$ cm⁻³, $1 \times 10^{14}$ cm⁻³, and $1 \times 10^{15}$ cm⁻³, respectively. Since the electric currents which flow in those portions to which the depletion layer does not extend from the surface cannot be controlled by the gate voltage, it is necessary that the portion through which current can flow be limited to those portions within reach of the depletion layer growing from the gate, in order to make the transconductance $G_m$ large. Accordingly, for an n-channel device (p⁻ type region), the impurity concentration $N_A$ and the effective channel depth d in the vicinity of the source region are determined in the manner stated below. In the conducting state of the device, a predetermined forward voltage (positive voltage) is normally applied to the gate electrode which serves as a control electrode. When the potential of the p⁻ type channel region is lowered and/or when an inversion layer is produced in the vicinity of the gate electrode, a current flows. In the cut-off state, the gate potential is usually held at the same potential as that of the source region. It should be understood as a matter of course that there are instances wherein a reverse voltage is applied. However, in view of the fact that there is often the case wherein it is convenient to operate the gate region and the drain region with either a positive or negative voltage, it is desirable to arrange so that the current is cut off when the gate potential is set at the same potential as the source region.

In order that the current in a insulated gate transistor can be controlled with good efficiency, it is desirable that the effective channel width d falls almost within or within the width W of the depletion layer which is obtained by the formula stated previously. Where gate regions are provided on both sides of the channel region, depletion layers will grow into the channel region from both sides of the channel region. Therefore, the gate spacing can be increased to about twice as large.

Figure 3:
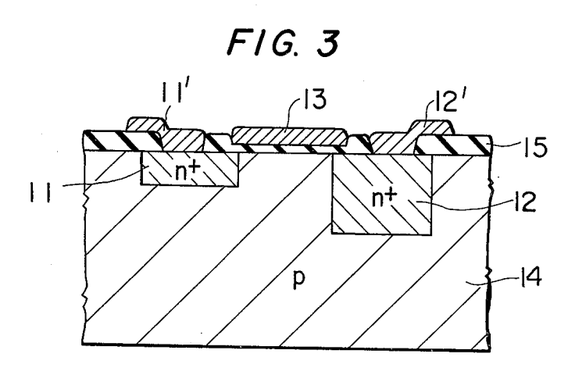
FIGS. 3 to 10 are schematic sectional views of different embodiments of the present invention, respectively.

FIG. 3 shows an embodiment of the present invention. In this embodiment, the channel length is reduced, and at the same time therewith the source region is formed thin (as compared to the drain) to ensure a rise in the efficiency with which the drain current is controlled by a gate voltage. The impurity concentrations of the respective regions are: about $10^{17}-10^{21}$ cm⁻³ for n⁺ type regions 11 and 12; and about $10^{13}-10^{16}$ cm⁻³ for the p type region 14. The depths of the source region and the drain region are, for example, about 0.1–0.6 μm and about 0.2–1.0 μm, respectively. The channel length $l_g$ is selected at a value of about $l_g \approx (2\epsilon/qN_D \cdot V_{D\,max}/m)^{\frac{1}{2}}$, where $\epsilon$ represents the dielectric constant of the semiconductor body, q represents the magnitude of unit electronic charge, $N_D$ represents the impurity concentration of the p type region 14, m represents a numerical coefficient determined by a desired operation state and by configuration of the device, being usually about 1–10. The value of this coefficient may be selected larger than 10, of course. As long as a positive gate bias voltage is below a threshold voltage at which an inversion layer begins to be formed below the gate electrode, the drain current is formed almost with those injected carriers which are controlled by the height of the potential barrier produced in the foreground of the source region. Accordingly, the drain current will follow basically the exponential law. Needless to say, this exponential law is one modified by the series resistance $r_s$ from the source to the potential barrier and/or by the resistance $r_d$ from the potential barrier to the drain. It is also needless to say that deviation from the exponential law can take place if such factor as trap levels are present. When the gate voltage takes a value above the threshold value and when thus an inversion layer is formed, the phenomenon of the current component which represents the exponential law being superposed by a current component of the resistance nature will occur. In the structure shown in FIG. 3, electrons are allowed to flow only through that region located close to the surface in the vicinity of the source region 11. On the drain side, however, the current will flow while travelling divergently deeply in the depleted p type region 14, in a manner close to bulk conduction. Therefore, the resistance $r_d$ is small whereas the transconductance $g_m$ is large, and a characteristic represented by a steep rise of current is obtained.

The critical condition for exhibiting a saturating type current vs. voltage characteristic or for exhibiting a non-saturating type characteristic is given by the value of product of the series resistance $r_s$ from the source to the intrinsic gate, which controls the current, (meaning either the pinch-off point or the position of the potential barrier; but in this specification such intrinsic gate will be generally called as the pinch-off point) and the transconductance $G_m$ which is peculiar to the device. If the dependency of the product of $r_s$ and $G_m$ on drain voltage $V_d$, drain current $I_d$ and gate voltage $V_g$ is not prominent, a first approximation may be made so that the device will exhibit saturating characteristics if $r_s \cdot G_m > 1$, whereas the device will exhibit non-saturating characteristics when $r_s \cdot G_m < 1$ in the low current region. If, however, the dependency of $r_s \cdot G_m$ on $V_d$, $V_g$ and $I_d$ is prominent, the aforesaid conditions will vary substantially.

Figure 4:
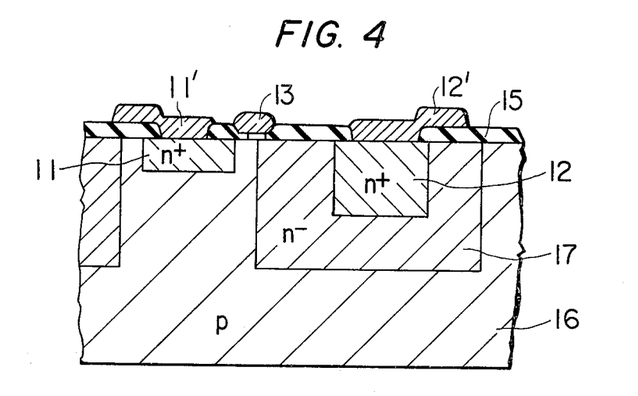

FIG. 4 shows another embodiment of the present invention, which is arranged to be operative so that a rapidly increasing current flows through the semiconductor region at lower drain voltage and that the device has a small gate-drain capacitance $C_{gd}$ and has a highly elevated gate-drain breakdown voltage. An n⁻ type region 17 is provided on the drain side. The impurity concentration of this n⁻ type region is in the order of $10^{12}$–$10^{15}$ cm⁻³. So long as this n⁻ type region 17 is depleted only by the built-in potential at the pn junction, the influence of a drain voltage will immediately extend to the vicinity of the source region by the mere application of only a small drain voltage. Because of a large transconductance $g_m$ and small $C_{gd}$ and $C_{gsub}$, this embodiment is suitable for high-speed operation.

Figure 5:
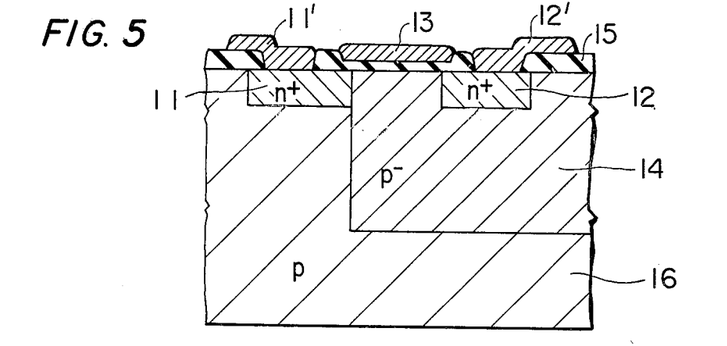

In the structures shown in FIGS. 3 and 4, there still resides the inconvenience that, because of the presence of current flowing from the bottom of the source region, there flows a current which is not controlled by a gate voltage. An example which eliminates this inconvenience is shown in FIG. 5. There is formed a p type region 16 of a high impurity concentration, adjacent to the bottom surface of the source region. The impurity concentration of the p⁻ type region 14 is, for example, in the order of $10^{12}$–$10^{16}$ cm⁻³, while the impurity concentration of the p type region 16 is in the order of $10^{13}$–$10^{17}$ cm⁻³. The built-in potential between the n⁺ type region 11 and the p⁻ type region 14 is smaller than the built-in potential between the n⁺ type region 11 and the p type region 16. Accordingly, the injection of carriers from the source n⁺ type region 11 mostly takes place toward the p⁻ type region 14. The drain n⁺ type region 12 has a depth substantially the same as that of the source n⁺ type region 11. These two regions can be formed in a same masking-doping process. By augmenting the masking-doping step, the drain n⁺ type region 12 may be formed so as to have a depth greater than that of the source n⁺ type region 11 to obtain a higher transconductance $G_m$.

In order to materialize a further efficient control of the drain current, it is effective to more positively limit the channel width of that portion of the semiconductor region in which the drain current is substantially controlled.

Figure 6:
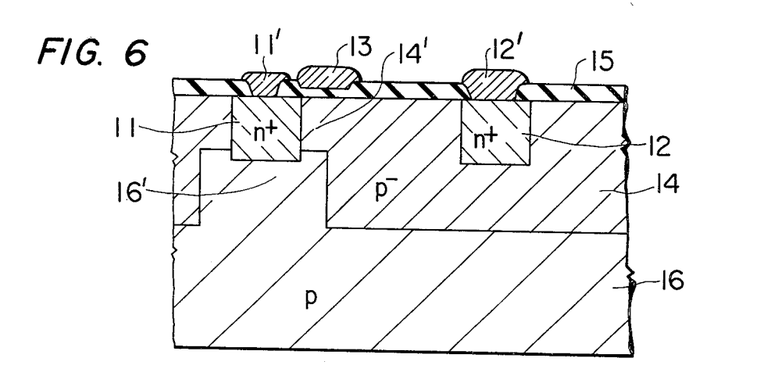

FIG. 6 shows an embodiment in which the width of that high resistivity region which serves as the channel region is formed so as to have a narrow width at a location near the source region. The gate electrode 13 is provided at least about such narrowed channel region 14'. More specifically, an effective channel region 14' having a narrow width is defined by a p type region 16' which extends from the p type substrate 16 to the bottom surface of the source n⁺ type region 11 and which extends horizontally further therefrom for some distance toward the drain n⁺ type region 12. The distance from the semiconductor surface to the p type region 16', i.e. the channel width is so selected that the potential distribution within the p⁻ type region 14' can be easily controlled by a gate voltage. More specifically, the p⁻ type region 14' is formed so as to ensure that, when predetermined biases are applied to the control electrode 13 and to the drain electrode 12', the portion between the source and the drain will become rendered into the punching-through state, and that, thus, the influence of the gate voltage applied will extend to the entire p⁻ type region 14'. When the depletion layer extending from the surface of the drain region 12 into the p⁻ type regions 14 and 14' reaches the vicinity of the source region, the control of flow of current is carried out capacitively by both the drain voltage and the gate voltage. Therefore, like a static induction transistor, the structure of this instant example will exhibit a non-saturating type current vs. voltage characteristic. It should also be understood that it is effective to arrange the impurity and concentration of the p⁻ type region 14' which is located near the source region to be higher than that of the other p⁻ type region 14. According to this embodiment, the gate electrode has a small size and also the p type region 16' can be formed only in a required portion of the semiconductor body. Therefore, the capacitances between the source and the control electrode, between the control electrode and the drain, between the drain and the substrate, between the control electrode and the substrate, and so forth, are invariably small, and therefore, this embodiment is suitable for high-speed operation.

Figure 7:
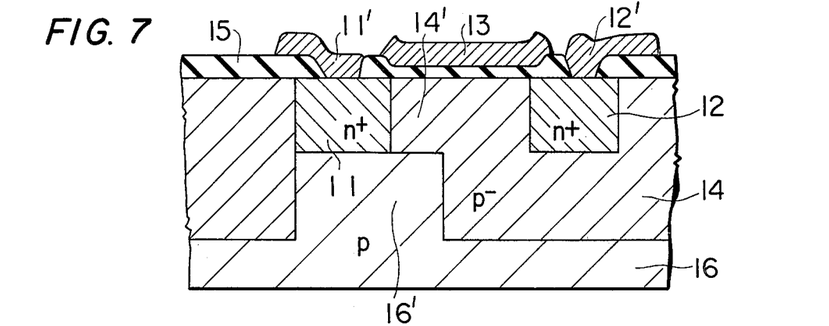

In the structure shown in FIG. 6, there is the need that the p⁻ type region 14 located between the effective channel region 14' and the drain n⁺ type region 12 be depleted by a drain voltage. To meet this end, an alteration of the structure of FIG. 6 is shown in FIG. 7. In FIG. 7, the gate electrode 13 extends from above the source region to above the drain region. It should be understood also that, in the structure shown in FIG. 6, the source region 11 is formed on the central portion of the protrusion-shaped p type region 16'. In the embodiment shown in FIG. 7, however, the source region 11 is formed at a position located on one side end portion of the p type region 16'. In case the effective channel region 14' and the source region 11 are formed in same dimensions as those of the example shown in FIG. 6, the p type region 16' will have a smaller size, and this will be useful in reducing the source capcitance. Also, since the gate electrode 13 is extended up to a site above the drain region 12, drain current will be allowed to flow even at a low drain voltage. However, it should be understood that the gate drain capacitance of this example increases for the amount of approach of the gate electrode 13 toward the drain electrode 12' and toward the drain region 12.

In the embodiments shown in FIGS. 6 and 7, it should be understood that, when the p⁻ type region 14 is depleted, a negative space charge occurs which will subject those electrons injected from the source n⁺ type region 11 to a repulsive force.

Figure 8:
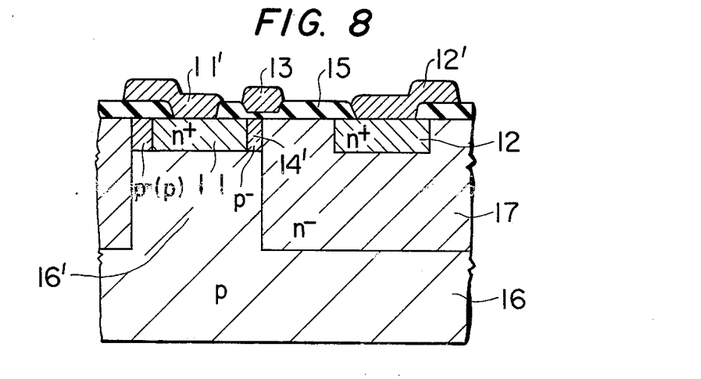

FIG. 8 shows an example having a small gate-drain capacitance, a high breakdown voltage, and being free of the aforesaid space charge effect. Around the drain n⁺ type region 12 is provided an n⁻ type region 17 having a conductivity type same as that of said drain region 12. This arrangement contributes to reducing the drain capacitance and to elevating the gate-drain breakdown voltage. This n⁻ type region 17 has a conductivity type same as that of the drain region 12, and accordingly said region 17 may be regarded as a subsidiary drain region. As those electrons injected from the source region 11 arrive at this subsidiary drain region 17, there will flow a drain current. If subsidiary drain region 17 becomes depleted, the resulting positive electric charge will have the effect of attracting those electrons injected from the source region 11. Accordingly, the source-drain transit time becomes short, and thus high-speed operation is materialized. It should be understood also that, within the n⁻ type region 17, electrons flow divergently through the semiconductor body, as in the case of the preceding embodiments. In the embodiment shown in FIG. 8, there is shown an instance wherein both vertical end edge lines of the n⁻ type region 17 located just below the semiconductor surface are in agreement with both vertical end edge lines of the protrusion-shaped p type region 16'. It may be needless to say that such agreement is not necessarily required.

Figure 9:
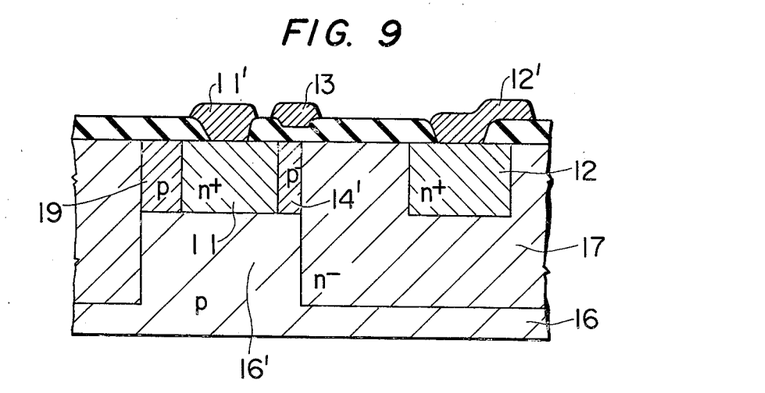

FIG. 9 shows an alteration of the structure of FIG. 8. As noted in FIG. 8, the source region 11 is formed with the p⁻ type region 14', and a portion of the p⁻ type region 14' located in that portion departing from the source region 11 and extending toward the drain region 12 is used as the effective channel region. In FIG. 9, however, a p type region 19 is formed at such site adjacent to that side of the n⁺ type source region not facing the n⁺ drain region 12. The arrangement of this embodiment is that those surface portions of the source region 11 which do not contribute to the formation of drain current are covered by the p type regions 19 and 16' to ensure that carriers will be injected only into the effective channel region 14'. The p type region 19 and the p type region 16' may be formed by a common region.

Figure 10:
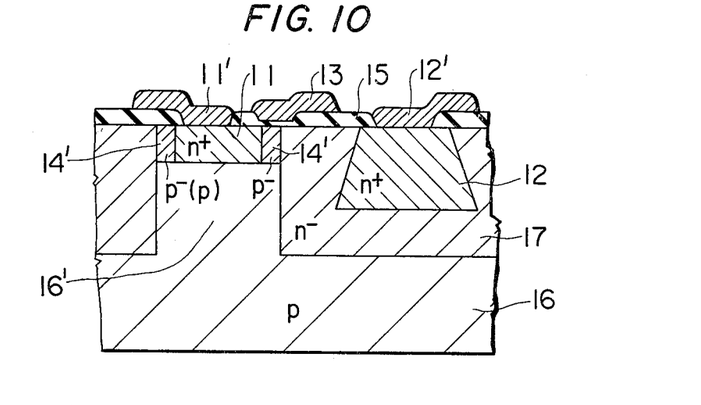

FIG. 10 shows an embodiment having an improved high frequency characteristic by arranging so that electrons flowing divergently through the bulk will be efficiently taken out from the drain region, and that the variance of the transit time of electrons from the source region to the drain region is reduced. In this embodiment, the n⁺ type drain region 12 has such configuration as will diverge progressively as this region extends deeper into the semiconductor body toward the source region 11, so that the distance from the effective channel region 14' to the drain region 12 is substantially uniformalized irrespective of the depths from the semiconductor surface.

Figure 11A:
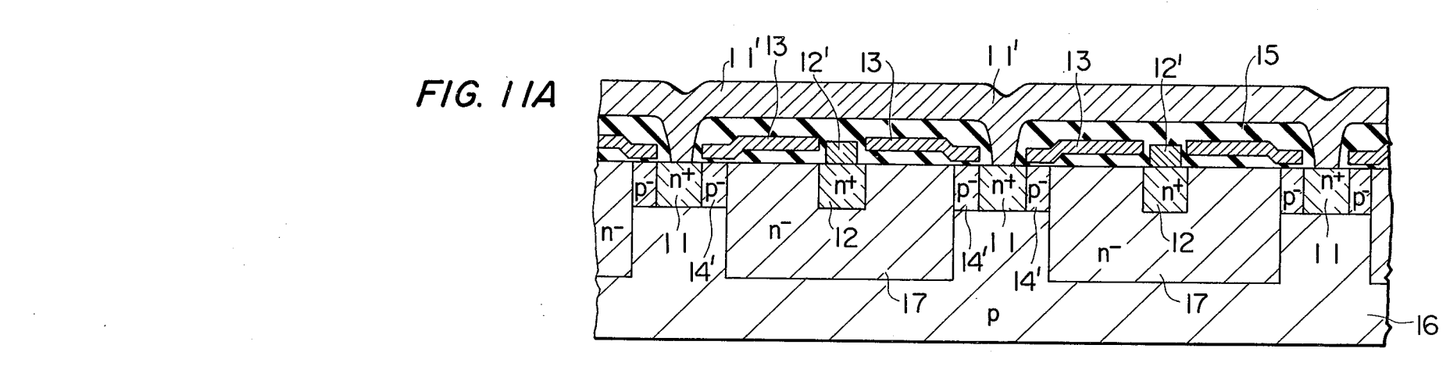
FIGS. 11A and 11B are a schematic sectional view and a schematic top plan view of a discrete device according to the present invention.
Figure 11B:
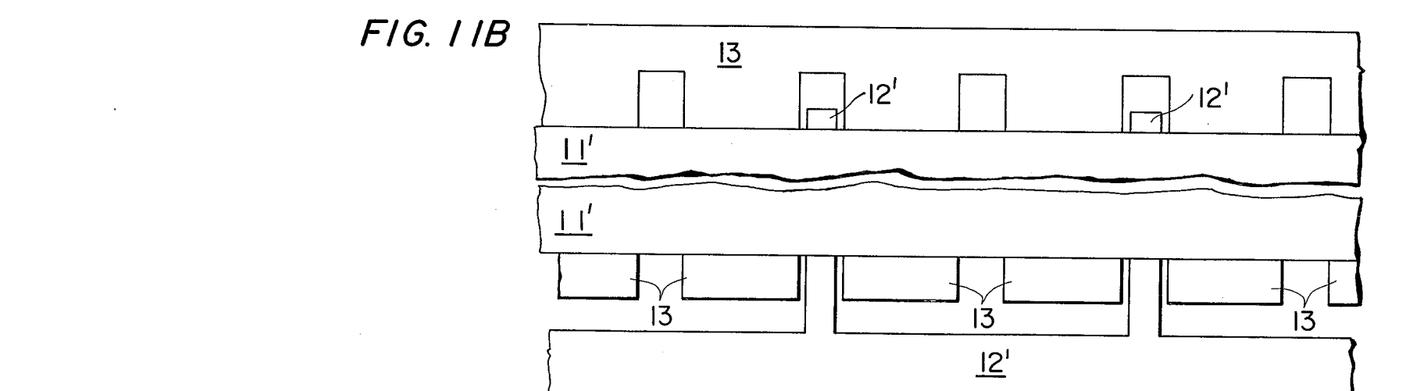

FIGS. 11A and 11B show an embodiment of a discrete device embodying the present invention. In this example, a multi-channel structure is adopted in order to cause a large current to flow, and the respective channels are formed with a modified combination structure of those shown in the embodiments of FIGS. 7 and 8. Since a number of channels are formed in parallel with each other, each source region ejects carriers from both sides thereof, and each drain region receives carriers at both sides thereof. The drain electrode 12' and the gate electrode 13 form a mutually facing inter-digital configuration, and a source electrode 11' is provided above these electrodes. FIG. 11B schematically shows the electrode configuration as stated above. Alterations of this embodiment will be apparent to those skilled in the art, such as forming the source region in a comb shape, or as forming the gate or the drain electrode as an overlie layer. The channel region 14' may be formed of parallel stripe regions or apertured rectangular shape surrounding the source region 11.

Figure 12:
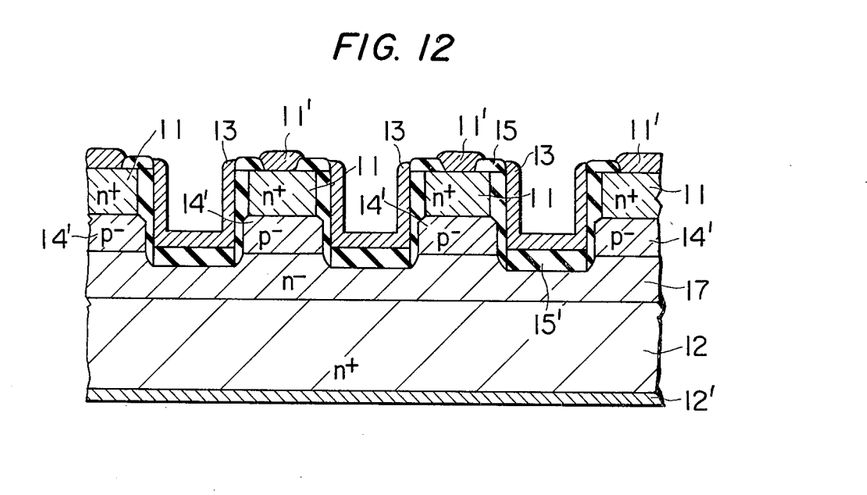
FIG. 12 is a schematic sectional view of another discrete device according to the present invention.

FIG. 12 shows an example of another discrete device wherein an insulated gate structure is provided in a recessed portion formed in the surface of the semiconductor body. A source region 11, a channel region 14', a sub-drain region 17 and a drain region 12 are provided in a row in a direction perpendicular to the surface of the substrate. Carriers are allowed to flow vertically in the Figure. A gate structure for controlling these carriers is provided in a recess which is cut into the semiconductor body from the surface thereof. A thick insulating film is formed between the source region 11 and the gate electrode 13 to reduce the source-gate capacitance. Insulated gate structures are formed on both sides of the channel region. Therefore, it is possible to make the channel width greater as compared with the horizontal type structure. The configuration of the recess is not limited to that illustrated. It is also possible, for example, to provide a gate electrode only at a limited portion of the recess and to thereby reduce that portion of the gate electrode superposing on the source region 11, to reduce the source-gate capacitance.

Figures 13, 14, 15:
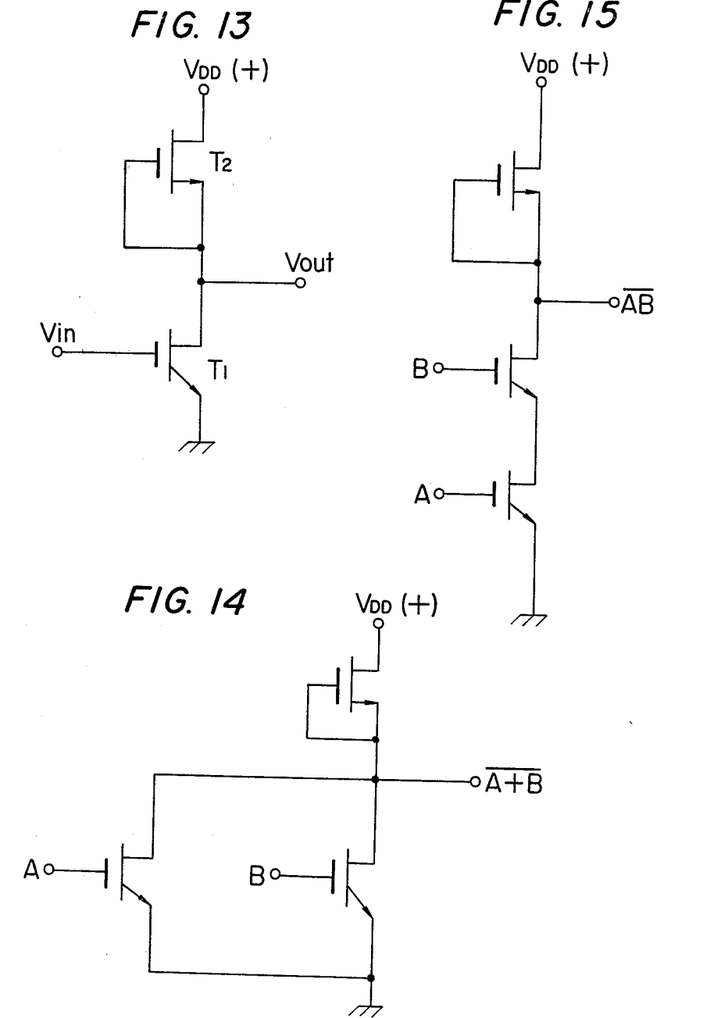
FIGS. 13 to 15 are equivalent circuit diagrams of examples of integrated circuit.

Next, description will be made of examples wherein the IG-SIT exhibiting a non-saturation type current vs. voltage characteristic described above is used in constructing integrated circuits. FIG. 13 is a diagram of an inverter circuit wherein a MOS-FET T₂ of depletion mode is used as a load transistor. $V_{in}$ represents an input voltage, $V_{out}$ an output voltage, and $V_{DD}$ a power supply voltage. When $V_{in}$ is at a low level, the IG-SIT T₁ is in its cut-off state and $V_{out}$ is at a high level. When $V_{in}$ is rendered at a high level, the IG-SIT T₁ will be rendered conductive, and $V_{out}$ will be at a low level.

FIGS. 14 and 15 show a NOR circuit of two inputs and a NAND circuit of two inputs, respectively. In each of these two examples, the load is comprised of an IG-FET of depletion mode. The driver transistor is comprised of an IG-SIT of the present invention. It is needless to say that the load transistor may be comprised of an IG-FET of enhancement mode. It should be understood that it is possible also to contruct a complementary structure by the use of only IG-SIT's of the present invention.

It is needless to say that the examples of the present invention are not limited to those described and illustrated herein. It is a matter of course to those skilled in the art that the respective regions may have conductivity types which are the reverse of those mentioned in these examples. In short, any structure may be employed provided that the device has a short channel length as an effort to make small the series resistance from the source region to the pinch-off point.

The IG-transistors embodying the present invention may be manufactured by relying on known diffusion technique, ion implantation technique, crystal growth technique, fine precessing technique and like techniques.

The insulated gate type transistor according to the present invention is arranged to have a short channel distance to reduce the series resistance, and to have a large transconductance, and this transistor exhibits a steep build-up of current, and has a small inter-electrode capacitance, and therefore, it is suitable for high-speed operation, and thus the industrial value of this transistor is extremely high.

What is claimed is:

1. An insulated gate type transistor formed in a semiconductor chip, comprising:
   a heavily-doped source semiconductor region of a first conductivity type, for supplying charge carriers;
   a heavily-doped drain semiconductor region of said first conductivity type, for receiving the carriers supplied from said source;
   a channel semiconductor region formed between said source and drain regions, having a second conductivity type opposite to said first conductivity type;
   an insulated gate structure including an insulating film formed on said channel semiconductor region and a conductive gate electrode formed on said insulating film;

said channel region having such dimensions and a resistivity that the potential profile from said source region to said drain region for the carriers supplied from said source has a potential barrier which can be controlled by potentials of said gate structure and of said drain region, and means provided in the neighborhood of said source region for increasing the ratio of the amount of carriers reaching said drain region to the total amount of carriers supplied from said source region.

2. An insulated gate type transistor according to claim 1, wherein: said source and drain regions are formed in said semiconductor chip adjacent to a principal surface thereof, and said means comprises said heavily-doped source semiconductor region having a shallower depth than that of said heavily-doped drain region.

3. An insulated gate type transistor according to claim 2, further comprising: a subsidiary drain semiconductor region of said first conductivity type and of high resistivity, formed in said semiconductor chip, disposed around said drain region and at least between said channel semiconductor region and drain region.

4. An insulated gate type transistor according to claim 1, wherein: said means comprises a suppressing semiconductor region of said second conductivity type having a resistivity lower than that of said channel region formed adjacent to a portion of said source region so as to eliminate injection of carriers therefrom.

5. An insulated gate type transistor according to claim 4, wherein: said source region and said drain region are formed in said semiconductor chip adjacent to a principal surface thereof, and said suppressing semiconductor region is located adjacent to at least a bottom portion of said source region in said semiconductor chip.

6. An insulated gate type transistor according to claim 5, wherein: said suppressing semiconductor region has a surface extending from said bottom portion of said source region toward said drain region and defining a boundary of said channel semiconductor region.

7. An insulated gate type transistor according to claim 6, wherein: said channel semiconductor region is formed between said principal surface and said suppressing semiconductor region, and the transistor further comprises: a subsidiary drain semiconductor region of said first conductivity type having a higher resistivity than that of said drain region and formed around said drain region and also adjacent to said channel and the suppressing semiconductor regions.

8. An insulated gate type transistor according to claim 7, wherein: said drain region has a depth greater than that of said source region.

9. An insulated gate type transistor according to claim 8, wherein: said drain region has a shape approaching said source region as this shape goes deeper toward the bottom of substrate.

10. An insulated gate type integrated semiconductor device formed in a semiconductor chip and including at least one insulated gate transistor, said insulated gate transistor comprising:

a heavily-doped source semiconductor region of a first conductivity type for supplying charge carriers;

a heavily-doped drain semiconductor region of said first conductivity type for receiving the carriers supplied from said source;

a channel semiconductor region formed between said source and drain regions and having a second conductivity type opposite to said first conductivity type;

an insulated gate structure including an insulating film formed on said channel semiconductor region and a conductive gate electrode formed on said insulating film;

said channel region having such dimensions and a resistivity that the potential profile from said source region to said drain region for the carriers supplied from said source has a potential barrier which can be controlled by potentials of said gate structure and of said drain region; and means provided in the neighborhood of said source region for increasing the ratio of the amount of carriers supplied from said source region, controlled by the potential of said gate structure, and reaching said drain region, to the total amount of carriers injected from said source region.

11. An insulated gate type integrated semiconductor device according to claim 10, wherein: said source and drain regions are formed in said semiconductor chip adjacent to a principal surface thereof, and said means comprises said heavily-doped source semiconductor region having a shallower depth from said surface than that of said heavily-doped drain region.

12. An insulated gate type integrated semiconductor device according to claim 10, wherein: said means comprises a suppressing semiconductor region of said second conductivity type having a resistivity lower than that of said channel region formed adjacent to a portion of said source region so as to eliminate injection of carriers therefrom.

13. An insulated gate type transistor formed in a semiconductor chip, comprising:

a heavily-doped source semiconductor region of a first conductivity type, for supplying charge carriers;

a heavily-doped drain semiconductor region of said first conductivity type, for receiving the carriers supplied from said source;

a channel semiconductor region formed between said source and drain regions, having a second conductivity type opposite to said first conductivity type;

an insulated gate structure including an insulating film formed on said channel semiconductor region and a conductive gate electrode formed on said insulating film;

means for completely depleting said channel region and for generating a potential barrier being responsive to the respective potentials of both said gate and said drain; and means for orienting carriers supplied from said source to said drain through said potential barrier.

14. The transistor of claim 1 wherein:

said source and drain regions are each disposed adjacent to a first principal surface of said chip, and said means for directing comprises said source and drain regions, where said drain region extends to a greater depth from said first principle surface than said drain region.

15. The transistor of claims 13 or 14 wherein: said means for directing comprises a carrier suppression semiconductor region of said second conductivity type and of a higher impurity concentration than that of said channel region, said carrier suppression region being disposed adjacently underlying said source region.

16. The transistor of claim 15 wherein said suppression region includes a portion extending laterally beyond said source towards said drain.

* * * * *